United States Patent [19]
Huynh et al.

[11] Patent Number: 5,935,869
[45] Date of Patent: Aug. 10, 1999

[54] METHOD OF PLANARIZING SEMICONDUCTOR WAFERS

[75] Inventors: Cuc Huynh, Jericho; Rangarajan Jagannathan, South Bulington, both of Vt.; Amarnath Jha, Phoenix, Ariz.; Thomas Martin, Essex Junction, Vt.; Keith Pope, Danbury, Conn.; Thomas Sandwick, Hopewell Junction, N.Y.

[73] Assignee: International Business Machines Corporation, Armonk, N.Y.

[21] Appl. No.: 08/889,994

[22] Filed: Jul. 10, 1997

[51] Int. Cl.$^6$ ..................................................... H01L 21/00
[52] U.S. Cl. ................. 438/692; 134/2; 216/38; 438/745
[58] Field of Search .................. 216/88, 38, 89; 438/691, 692, 693, 745; 134/1.3, 2

[56] References Cited

U.S. PATENT DOCUMENTS

| | | |
|---|---|---|
| 4,156,619 | 5/1979 | Griesshammer . |
| 4,276,186 | 6/1981 | Bakos et al. . |
| 4,892,612 | 1/1990 | Huff ........................................ 438/693 |
| 5,078,801 | 1/1992 | Malik . |
| 5,176,756 | 1/1993 | Nakashima et al. . |
| 5,188,987 | 2/1993 | Ogino . |
| 5,320,706 | 6/1994 | Blackwell . |
| 5,397,397 | 3/1995 | Awad . |
| 5,409,544 | 4/1995 | Ota et al. . |
| 5,455,198 | 10/1995 | Choi . |
| 5,478,436 | 12/1995 | Winebarger et al. . |
| 5,563,119 | 10/1996 | Ward ........................................ 134/2 X |

OTHER PUBLICATIONS

Post–Tungsten CMP Cleaning: Issues and Solutions; *Cleaning/Stripping*;Fury and Krusell; Oct. 1995.

IBM Technical Disclosure Bulleting; Post Chemical Mechanical Polishing Cleaning of Semiconductor Wafer; vol. 38, No. 03, Mar. 1995.

*Primary Examiner*—William Powell
*Attorney, Agent, or Firm*—Schmeiser, Olsen & Watts; Howard J. Walter, Jr.

[57] ABSTRACT

A CMP semiconductor wafer planarization method is provided employing an aqueous solution of a trialkanol amine as a wafer cleaning solution. Wafers are produced exhibiting a substantial reduction in semiconductor device failures as shown by a significant decrease in $m_1\text{-}m_1$ (metal to metal) shorts.

8 Claims, No Drawings

METHOD OF PLANARIZING SEMICONDUCTOR WAFERS

BACKGROUND OF THE INVENTION

1. Field Of The Invention

The present invention relates to a Chemical Mechanical Polishing (CMP) method for planarizing a semiconductor wafer utilizing a colloidal suspension of an alumina or silica based abrasive and an aqueous trialkanoamine solution.

2. Related Art

Chemical Mechanical Polishing (CMP) is a general procedure used to planarize semiconductor wafers. CMP involves a chemical- mechanical action which changes the surface of the wafer. As shown by Blackwell, U.S. Pat. No. 5,320,706, CMP can involve the use of abrasive particles, such as alumina or silica, which can be used in the form of a slurry, while the wafer is held against a rotating polishing pad. After the wafer has been polished, a post polishing cleaning process can be employed to effect removal of particulate.

Among the various post polishing cleaning methods, there are included intensive mechanical scrubbing procedures which may employ a brush cleaner with deionized water, megasonic cleaning heads, water jet, or chemical bath. However, such procedures often do not provide the conditions required to counteract the electrostatic or Van der Waals forces of the residual particulate.

Control of fine particle adhesion to an object in solution is further shown by Ota et al, U.S. Pat. No. 5,409,544, wherein the zeta- potential of fine particles are investigated. Malik, U.S. Pat. No. 5,078,801 shows a cleaning method for remnant particle removal from a semiconductor wafer after planarization polishing, by placing the wafers in a pH controlled bath.

A cleaning composition capable of removing flux residues from a ceramic substrate is described by Bakos et al, U.S. Pat. No. 4,276,186. Bakos et al. employ a cleaning mixture which includes N-methyl-2-pyrrolidone and an alkanolamine.

While various methods have been used to planarize semiconductor substrates using standard CMP procedures, only those methods providing nearly 100% particulate removal will satisfy the demands of the semiconductor industry. Currently used mechanical intensive scrubbing methods often have been found to be ineffective as a result of a build up of residue in the cleaner during high production periods. In particular instances, such as in the practice of post- tungsten CMP cleaning, where the semiconductor substrate may include tungsten studs recessed in planar $SiO_2$, slurry particles are often trapped or adhered to the studs.

SUMMARY OF THE INVENTION

The present invention is based on the discovery that an aqueous solution of a trialkanolamine, or "TEA", having the formula, $$[HO(C_nH_{2n})]_3N, \quad (1)$$

where n is an integer equal to 2 to 8 inclusive, has been found to be particularly effective as a cleaning agent for effecting the removal of CMP slurry. Advantageously, the TEA can be used as an aqueous solution at concentrations sufficient to provide a pH of up to about 10 in the polisher's spray head as a replacement for high purity deionized water. Alternatively, a suitable concentration of TEA in water, for example 0.001% to 5.0%, has been found to be effective in the unload station in place of deionized "DI" water. A megasonic cleaning head can be added as a further mechanical force means for dislodging slurry particles if desired.

In situations where a semiconductor wafers are processed having tungsten, or "W" vias, special post-tungsten CMP cleaning procedures can be required. For example, a tungsten CMP polisher may be necessary. The tungsten containing slurry also may contain iron as an impurity, in the form of $Fe^{+3}$. It has been found that the Fe impurities can be more readily removed in the form of the more soluble TEA complex, $Fe[N(C_nH_{2n})]_3]6$, where n is defined in formula 1. As a result cleaning efficiency, such as the removal of $Fe_2O_3$ residues, can be enhanced.

In addition to the above advantages, TEA usage in CMP semiconductor wafer procedures also has been found to be environmentally favorable. For example on weight basis, TEA has less nitrogen and less costly to abate in a waste stream. Although ammonium hydroxide or tetramethylammonium hydroxide have been used in CMP slurry removal applications, these materials either are in equilibrium with ammonia which can be a chemical exposure hazard.

STATEMENT OF THE INVENTION

There is provided by the present invention, a CMP semiconductor wafer slurry removal process comprising the use of a cleaning agent in the form of an aqueous solution of a trialkanolamine of formula (1).

In a further aspect of the present invention, there is provided a CMP semiconductor wafer slurry removal process, comprising the use of an aqueous solution of a trialanolamine of formula (1) during the polishing stage of the semiconductor wafer.

In an additional aspect of the present invention, there is provided a CMP semiconductor wafer planarization process, comprising the use of an aqueous solution of a trialkanolamine of formula (1) as a wet chemical bath, or in combination with a member selected from the group consisting of a brush, a water jet, and a megasonic cleaning head.

DETAILED DESCRIPTION OF THE INVENTION

Some of the trialkanolamines which are included within formula (1), are for example, triethanolamine, which is preferred, tripropanolamine, and tributanolamine. However, the trialkanolamines shown by formula (1) also include members which can have the same or different [HO$(C_nH_{2n})$]- groups attached to N, where "$_n$" is as previously defined.

In the practice of the invention, the semiconductor wafer is subjected to a polishing action by applying an abrasive polishing slurry to a polishing pad which is used to polish the wafer. Useful polishing slurries are Cabot Semi-Sperse W-A355 and Cabot Semi-Sperse Fe10. The use of an aqueous TEA solution can be applied during polishing, or can be subsequently utilized as a rinse to clean the wafer surface or wafer carrier.

If desired, the polished wafers can be submerged in an aqueous solution of TEA during the unload station stage. While a concentration of TEA in water sufficient to provide a pH of up to about 10 can be employed during the polishing stage, a concentration in the range of about 0.001% to about 5% can be used in the unload station of the polisher. Under normal conditions, a pH of the wafer medium is normally about 5.0 due to carbonate ions in solution arising from $CO_2$ in air.

In order that those skilled in the art will be better able to practice the present invention, the following examples are given by way of illustration and not by way of limitation. All parts are by weight unless otherwise indicated.

EXAMPLE

Several semiconductor wafers having planar $SiO_2$ with a small percentage of inlaid tungsten are planarized for 3–5 minutes with a Rodel SubA 500/IV Stacked polishing pad using a down-force of 3 to 7psi, a spindle speed of 50 to 100 rpm, a table speed of 50 to 100 rpm and an alumina slurry having a solids content of about 3.0 (Wt %), a viscosity of between 1.3 to <5 centipoise and a pH of 1.7 to 4. The planarized wafers are then brush cleaned with deionized distilled water followed by a 10 second touchup polish with colloidal silica and dilute aqueous KOH solution. The planarized wafers are then subjected to a final brush clean with deionized water.

Upon drying for 15 minutes, the wafers are analyzed for defects in an Amray 2030 defect review SEM using an Oxford is X ray collector. This procedure is used to detect the nature of any residual slurry, with respect to particle size, and particular elements. It is found that on the average, the wafers exhibit an excessive amount of residual slurry resulting in device failure as shown by $m_1$-$m_1$ (metal to metal) shorts.

The above procedure is repeated, except that after planarization, the wafers are subjected to a treatment with an aqueous solution of triethanolamine in place of deionized water. The aqueous solution oftriethanolamine has a pH of about 10 and is dispensed as a rinse solution during a follow up polishing or brush cleaning step. The triethanolamine treatment step is then followed by the same 10 second touchup polish with colloidal silica and dilute aqueous KOH solution, followed by a final brush clean with deionized water. The triethanolamine amine treated wafers are found to be substantially free of residual slurry. In addition, they also show a substantial reduction in device failures as shown by a marked reduction in $m_1$-$m_1$ shorts.

What is claimed is:

1. A chemical mechanical polishing (CMP) semiconductor wafer slurry removal process, comprising the following steps:

polishing a semiconductor wafer in a slurry; and applying an aqueous solution of trialkanolamine to the semiconductor wafer after the polishing step to remove the slurry.

2. A CMP semiconductor wafer planarization process in accordance with claim 1, wherein the trialkanolamine is triethanolamine.

3. The CMP semiconductor water slurry removal process of claim 1, wherein the trialkanolamine is selected from the group consisting of tripropanolamine and tributanolamine.

4. A CMP semiconductor wafer planarization process in accordance with claim 1, where the trialkanolamine is used at a pH of about 10.

5. A CMP semiconductor wafer planarization process in accordance with claim 1, where the trialkanolamine is used at a concentration of 0.001% to 5.0%.

6. A CMP semiconductor wafer slurry removal process, comprising the use of an aqueous solution of a trialkanolamine of the formula, $$[HO(C_nH_{2n})]_3N,$$

during the polishing stage of the semiconductor wafer, where n is an integer equal to 2 to 8 inclusive.

7. A semiconductor cleaning process, comprising the following steps:

providing a semiconductor wafer;

chemical mechanical polishing the semiconductor wafer in a slurry;

applying an aqueous solution of trialkanolamine to the semiconductor wafer until the slurry and any residual particulate matter have been removed.

8. A method of using trialkanolamine to clean a semiconductor wafer, comprising the following steps:

planarizing a semiconductor wafer; and cleaning the semiconductor wafer by applying an aqueous solution of trialkanolamine to the semiconductor wafer after the planarization.

* * * * *